United States Patent
Dziczek

(10) Patent No.: US 10,509,053 B2
(45) Date of Patent: Dec. 17, 2019

(54) RADIO FREQUENCY PROBE AND METHODS FOR FORMING

(71) Applicant: Raytheon Company, Waltham, MA (US)

(72) Inventor: David P. Dziczek, Westford, MA (US)

(73) Assignee: Raytheon Company, Waltham, MA (US)

( * ) Notice: Subject to any disclaimer, the term of this patent is extended or adjusted under 35 U.S.C. 154(b) by 44 days.

(21) Appl. No.: 15/800,686

(22) Filed: Nov. 1, 2017

(65) Prior Publication Data
US 2019/0128923 A1 May 2, 2019

(51) Int. Cl.
*G01R 1/067* (2006.01)
*G01R 31/28* (2006.01)

(52) U.S. Cl.
CPC ..... *G01R 1/06772* (2013.01); *G01R 1/06738* (2013.01); *G01R 1/06755* (2013.01); *G01R 31/2886* (2013.01)

(58) Field of Classification Search
CPC ............ G01R 1/06733; G01R 1/06738; G01R 1/0675; G01R 1/06755; G01R 1/06761; G01R 1/06772; G01R 1/06727; G01R 1/07342; G01R 31/2886
See application file for complete search history.

(56) References Cited

U.S. PATENT DOCUMENTS

| 4,563,640 | A | * | 1/1986 | Hasegawa | G01R 1/07342 324/72.5 |
|---|---|---|---|---|---|
| 4,871,964 | A | | 10/1989 | Boll et al. | |
| 4,894,612 | A | * | 1/1990 | Drake | G01R 1/06772 324/72.5 |
| 5,486,770 | A | * | 1/1996 | Johnson | G01R 1/06772 324/755.02 |
| 5,506,515 | A | * | 4/1996 | Godshalk | G01R 1/06772 324/755.02 |
| 5,884,395 | A | * | 3/1999 | Dabrowiecki | G01R 1/07342 29/592.1 |

(Continued)

OTHER PUBLICATIONS

Cascase Microtech, "*Infinity Probe* —High-frequency Performance with Low, Stable Contact Resistance;" Data Sheet; Infinity-BRO-0108; Jan. 2008; 4 Pages.

(Continued)

*Primary Examiner* — Thang X Le
(74) *Attorney, Agent, or Firm* — Daly, Crowley, Mofford & Durkee, LLP

(57) ABSTRACT

Radio frequency (RF) probes are provided herein having a spherical shaped probe tip. The RF probes include a main body extending from a probe housing, and a contact portion integrally formed with the main body and extending radially from the main body. The contact portion includes a tip, with at least a portion of the tip having a spherical outer surface. The probe tip can be formed such that it extends from the contact portion at a predetermined angle. The probe tip can be formed having a spherical contact surface to provide a reduced contact area as compared to other probes having non-spherical shapes. The spherical contact surface can be configured to reduce accumulation of material from a surface of a device being tested and/or reduce damage to the surface of the device being tested.

14 Claims, 5 Drawing Sheets

(56) References Cited

U.S. PATENT DOCUMENTS

| | | | | |
|---|---|---|---|---|
| 6,515,358 B1* | 2/2003 | Dass | ............... | H01L 24/03 |
| | | | | 257/679 |
| 6,603,322 B1* | 8/2003 | Boll | ............... | G01R 1/06772 |
| | | | | 324/756.04 |
| 6,727,716 B1* | 4/2004 | Sharif | ............... | G01R 1/06738 |
| | | | | 324/750.27 |
| 2003/0132769 A1* | 7/2003 | Boll | ............... | G01R 1/06772 |
| | | | | 324/754.07 |
| 2014/0021976 A1* | 1/2014 | Tanaka | ............... | G01R 1/07364 |
| | | | | 324/754.11 |

OTHER PUBLICATIONS

Picoprobe by GGB Industries Inc., "Model 40A—High Performance Microwave Probes;" Data Sheet; Printed on Sep. 1, 2017; 4 Pages.

Picoprobe by GGB Industries Inc., "Model 50A—High Performance Microwave Probes;" Data Sheet; Printed on Sep. 1, 2017; 4 Pages.

Picoprobe by GGB Industries Inc., "Model 40A—High Performance Microwave Probes;" Retrieved from http://www.ggb.com/40a.html on Sep. 1, 2017; 6 Pages.

\* cited by examiner

RADIO FREQUENCY PROBE AND METHODS FOR FORMING

BACKGROUND

As is known in the art, radio frequency (RF) probes are used test a variety of different integrated circuits. The integrated circuits can be tested when formed on a wafer or similar device, for example, by applying a probe to a surface of the integrated circuit to test a response of the different components forming the integrated circuit. However, the ends of the probe can cause damage to the surface of the wafers and/or cause damage to the probe itself.

For example, as the probe contacts the wafer material, the material can accumulate on the probe end and result in probe contact issues and increased failure rates, particularly during later testing. The probes are typically cleaned and/or the accumulated material can be scraped off or otherwise removed. The cleaning and/or removal of the accumulated material can result in damage to the probe themselves and/or a reduced life span of the probe. The time to clean or remove the accumulated material results in intermittent stoppages of the testing. Additionally, upon restarting of the testing, re-calibration of the system is typically required further delaying the wafer testing. Further, due to the potential issues caused by the probe ends, post wafer testing inspection can be necessary to validate probe contact on every wafer. Thus, increasing cost and/or time to complete wafer testing.

SUMMARY

In accordance with the concepts, systems, methods and techniques described herein a radio frequency (RF) probe is provided having a spherical shaped probe tip. The dimensions and shape of the probe tip (hereinafter tip) can be selected to mitigate or otherwise reduce material accumulation and/or potential damage to a surface of a device (e.g., semiconductor wafer) to be tested.

The tip includes a spherical contact surface that is intended to contact a surface of a device during testing or probing of the particular device. For example, the RF probe can be used to perform probing on thick plated material (TPM) devices and/or bump wafer devices. The spherical contact surface can have a predetermined diameter (or predetermined radius) that is selected to reduce its respective contact area as compared with other probes having non-spherical tips. In an embodiment, the diameter of the tip can be selected to reduce material accumulation during testing and/or reduce damage to the surface of the particular device being tested.

The contact portion and tip can be integrally formed. For example, in some embodiments, the contact portion and the tip can include the same material and form a single element. The tip can extend from the contact portion at a predetermined angle based at least in part on a particular application of the RF probe and/or the properties of the device to be tested.

The RF probe and each of its components (main body, contact portion, tip) can have different lengths based at least in part on a desired pressure to be applied to the surface of the device. In one embodiment, a length of one or more of the main body, the contact portion and/or the tip can be selected to reduce damage to the surface of the particular device, such as but not limited to, reducing a skating effect on bump wafers.

In a first aspect, a radio frequency (RF) probe includes a main body extending from a probe housing, and a contact portion integrally formed with the main body and extending radially from the main body. The contact portion includes a tip. At least a portion of the tip has a spherical outer surface. In some embodiments, the tip is formed having a spherical shape. The tip can be formed such that it extends from the contact portion at a predetermined angle.

A length of the main body can correspond to a pressure factor generated by the RF probe. The tip can be formed having a predetermined diameter. In some embodiments, the diameter of the tip corresponds to the length of the main body.

The predetermined angle the tip extends from the contact portion can range can from about 10 degrees to about 90 degrees.

The main body, the contact portion and the tip can be formed from the same material and form a single element. In some embodiments, the material of the contact portion and/or the tip includes at least one of beryllium-copper (BeCu), tungsten or nickel. An insulating layer can be formed over the main body.

The RF probe includes at least one of a microwave probe, high impedance probe, or a probe card.

In another aspect, a RF probe includes first, second and third main bodies extending from a probe housing, and first, second and third contact portions integrally formed with the first, second and third main bodies, respectively and extend radially from the first, second and third main bodies. The first, second and third contact portions include first, second and third tips, respectively, each having a spherical shape. In some embodiments, at least a portion of the first, second and third tips can have a spherical outer surface. The first, second and third tips are formed extending at a predetermined angle from the first, second and third contact portions, respectively.

A first planar surface can be formed on an edge of the first contact portion and adjacent to the first tip and a second planar surface can be formed on an edge of the third contact portion and adjacent to the third tip. The first, second and third tips can be spaced a predetermined distance from each other.

A first pressure factor of the first tip can correspond to a length of the first main body and the first contact portion. A second pressure factor of the second tip can correspond to a length of the second main body and the second contact portion. A third pressure factor of the third tip can correspond to a length of the third main body and the third contact portion.

Each of the first tip, second tip and third tip can have a predetermined diameter. In some embodiments, the first, second and third main bodies, the first, second and third contact portions and the first, second and third tips can include the same material and form a single element.

In another aspect, a method for forming a RF probe includes coupling a first main body to a probe housing such that the first main body extends radially from the probe housing, integrally forming a first contact portion with the first main body such that the first contact portion extends radially from the first main body, and forming a first tip on one end of the first contact portion. At least a portion of the first tip can be formed having a spherical outer surface. In some embodiments, the first tip is formed having a spherical shape. The first tip extends at a at a predetermined angle from the first contact portion.

A length of the main body can correspond to a pressure factor generated by the RF probe. The first tip can have a diameter of a predetermined length. In some embodiments, the diameter of the tip can correspond to the length of the first main body.

The method may further include integrally forming a second contact portion and a third contact portion with a second and third main bodies, respectively, such that the second contact portion and the third contact portion extend radially from the second and third main bodies, forming a second tip on one end of the second contact portion such that the second tip extends at the predetermined angle from the second contact portion and forming a third tip on one end of the third contact portion such that the third tip extends at the predetermined angle from the third contact portion. At least a portion of the second and/or third tips can be formed having a spherical outer surface. In some embodiments, the second and/or the third tip can be formed having a spherical shape.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements.

DETAILED DESCRIPTION

Radio frequency (RF) probes are described herein having a spherical shaped probe tip (or more simply tip). The tip can be formed having a spherical contact surface to provide a reduced contact area as compared to other probes having non-spherical shapes. For example, the at least a portion of the tip can be formed having a spherical outer surface. In some embodiments, the tip can be formed having a spherical shape. The spherical contact surface can be configured to reduce accumulation of material from a surface of a device being tested and/or reduce damage to the surface of the device being tested.

The RF probes described herein can be configured to perform testing or any form of probing on a variety of different types of wafer fabrication processes, such as but not limited to thick plated material (TPM) devices and/or bump wafer devices, aluminum pads, evaporated metal, all bump material (e.g., solder, tin, nickel (alloys), etc.).

The tip can be integrally formed with a contact portion and a main body, extending from a housing of the RF probe. In some embodiments, the tip, the contact portion and main body can be formed from the same material and form different portions of the same element.

The dimensions of the tip, the contact portion and/or the main body can be selected to mitigate or otherwise reduce material accumulation and/or reduce potential damage to the surface of the device being tested. For example, the length of the tip and/or the contact portion can be selected to achieve a desired pressure factor applied to the surface of the device being tested.

Figure 1:
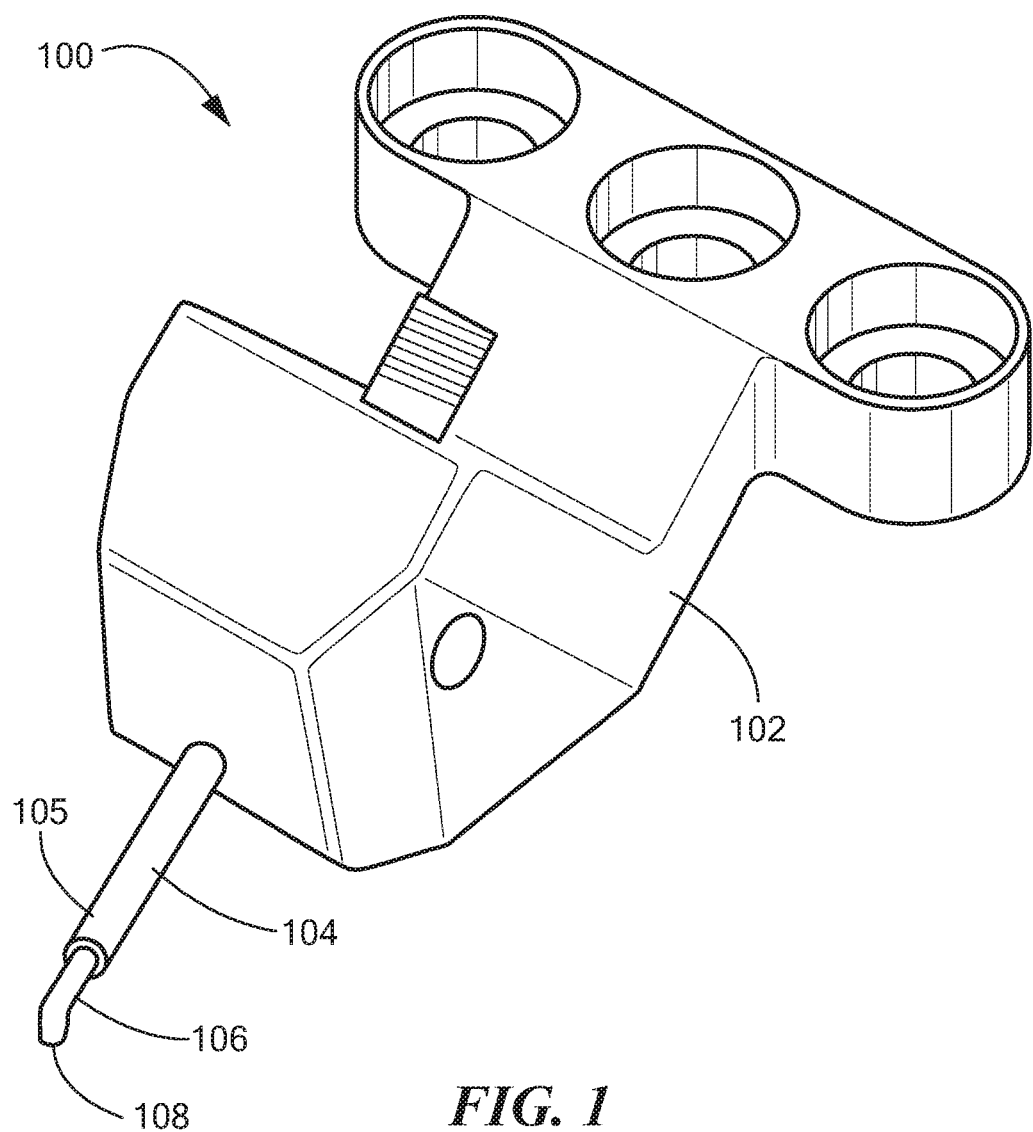
FIG. 1 shows a radio frequency (RF) probe having a tip with a spherical shape.
Figure 1A:
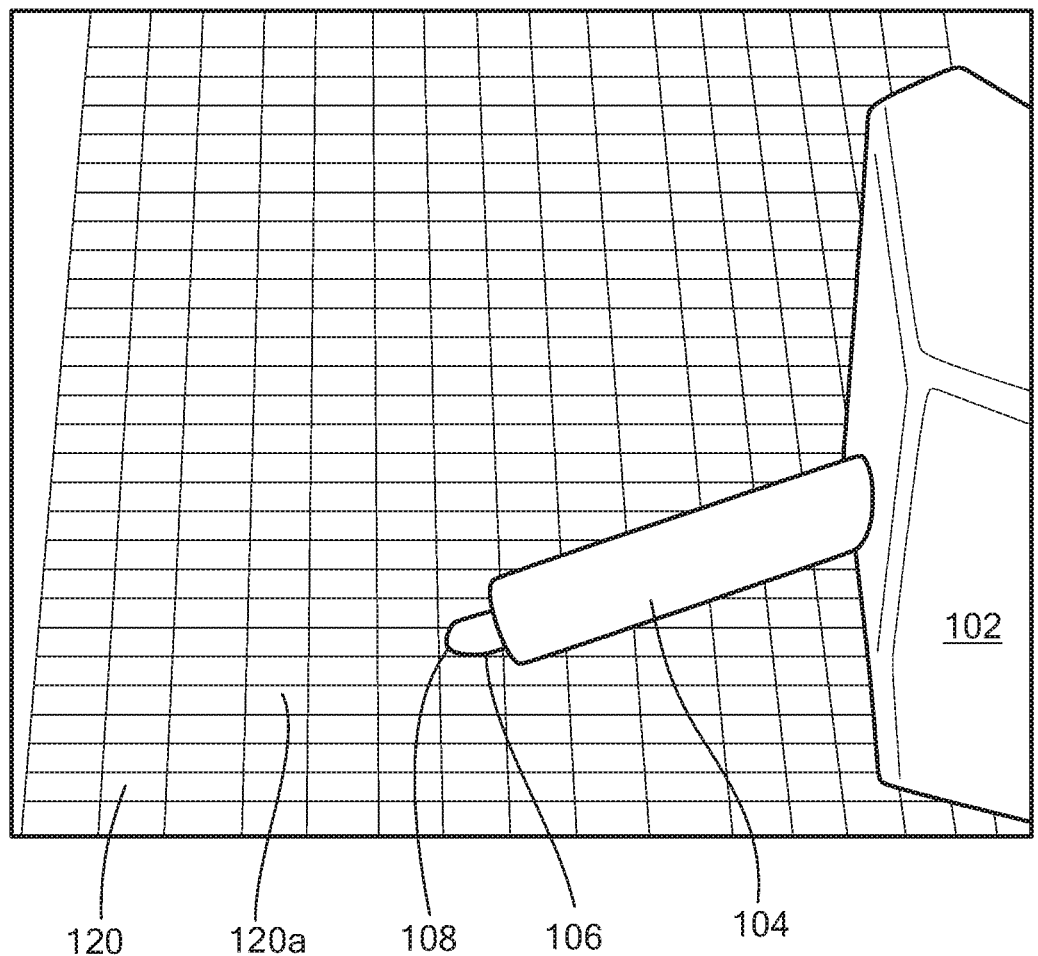
FIG. 1A shows a side view of the RF probe of FIG. 1 contacting a device.

Now referring to FIGS. 1-1A, in which like reference numerals indicate like elements, a RF probe 100 includes a housing 102 (e.g., probe housing) having a main body 104 extending from therefrom. A contact portion 106 extends from main body 104 and includes a tip 108. At least a portion of tip 108 can be formed having a spherical outer surface. In some embodiments, tip 108 can be formed having a spherical shape. Spherical and/or spherical shapes as used herein may refer to a round shape, globular shape or generally having properties shaped liked a sphere.

It should be appreciated that a shape of tip 108 may correspond to a sphere or a portion of a sphere. For example, in some embodiments, tip 108 may have a spherical shape but not form a complete sphere (e.g., a portion of a sphere may define an outer surface of tip 108).

RF probe 100 may be provided as at least one of a microwave probe, a high impedance probe or a probe card. RF probe 100 can be configured to perform testing and/or probing on a variety of different types of wafer fabrication processes, such as but not limited to thick plated material (TPM) devices and/or bump wafer devices. For example, RF probe 100 can be used to test and/or measure the response of internal components, such as but not limited to logic and memory chips (e.g., semiconductor dies) formed on or otherwise disposed on a surface of a particular wafer device.

Housing 102 can be formed in a variety of different dimensions and/or shapes based at least in part on the particular type of probe RF probe 100 is and/or the dimensions of RF probe 100.

Main body 104 can extend from housing 102. In the illustrative embodiment of FIG. 1, main body 104 includes an insulation layer 105 formed over an outer surface of main body 104.

A length of main body 104 can be selected based at least in part on a desired pressure factor. Pressure factor as used herein may refer to a pressure applied by RF probe 100 onto a surface of a device being tested or probed. In some embodiments, the length of main body 104 can be decreased to increase a pressure factor applied by RF probe 100. In other embodiments, the length of main body 104 can be increased to decrease a pressure factor applied by RF probe 100.

Contact portion 106 can extend radially from main body 104. In some embodiments, contact portion 106 can extend at the same angle relative to probe housing 102 as main body 104. Tip 108 can be integrally formed with contact portion 106 and extend at a predetermined angle to contact a surface of a device to be tested.

For example, and as illustrated in FIG. 1A, tip 108 is in contact with a surface 120a of device 120. Device 120 may include plated thick metal (PTM) processed wafers or bump processed wafers. During the testing of device 120, tip 108 comes in contact with surface 120a and may move horizontally and/or vertically to probe, test and/or measure the response of internal components formed on surface 120a. For example, surface 120a can be made of materials such as but not limited to gold, copper, aluminum, and/or any material associated with bump processes or bumping, as is known in the art.

Tip 108 can have a spherical shape (or a spherical outer surface) for reducing accumulation of the material from surface 120a and/or reducing damage caused to surface 120*a* during testing. Tip 108 will be described in greater detail below with respect to FIGS. 2-2A.

In an embodiment, RF probe 100 can have a power capability ranging from about 2 W to greater than 50 W. In some embodiments, RF probe 100 can have a power capability ranging from a continuous wave (CW), for example, from DC, to greater than 50 W.

Figure 2:
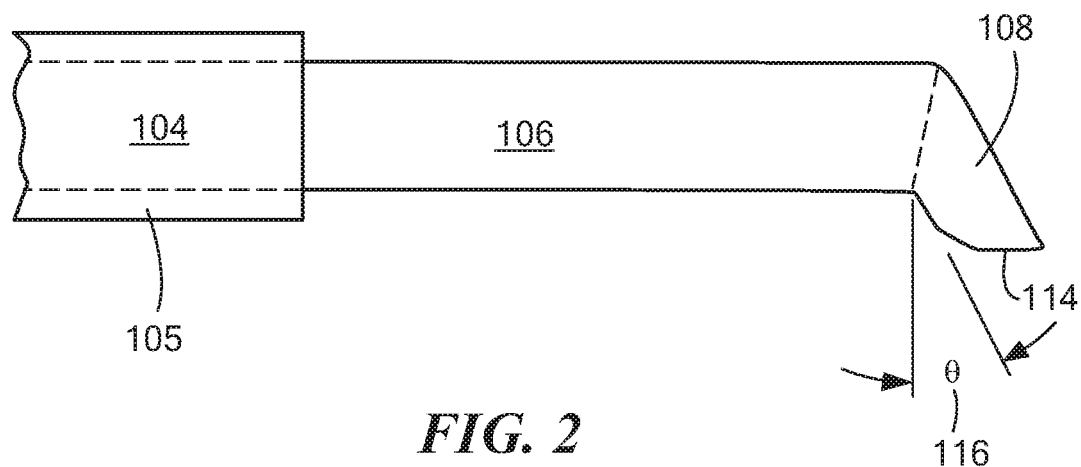
FIG. 2 shows a side view of a contact portion and tip of the RF probe of FIG. 1.

Now referring to FIG. 2, a side view of contact portion 106 and tip 108 is provided. In an embodiment, tip 108 can be integrally formed with contact portion 106 (e.g., single element). For example, in one embodiment tip 108 can be an extension of contact portion 106 and include the same material.

Tip 108 can extend from contact portion 106 at a predetermined angle 116 and be configured to contact and/or probe a surface of a device (e.g., surface 120*a* of device 120 of FIG. 1A). It should be appreciated that tip 108 can extend from contact portion 106 at various angles and the particular angle, here angle 116, can be selected based at least in part on a particular application of an RF probe and/or the device to be tested. In some embodiments, angle 116 may include any angle ranging from about 30 degrees to about 90 degrees. It should be appreciated, however that the angle may vary and may be selected to allow sufficient clearance of the body of the RF probe to a surface to be tested, such as a wafer surface.

Contact portion 106 and/or tip 108 can be formed from at least one of beryllium-copper (BeCu), tungsten or nickel.

Figure 2A:
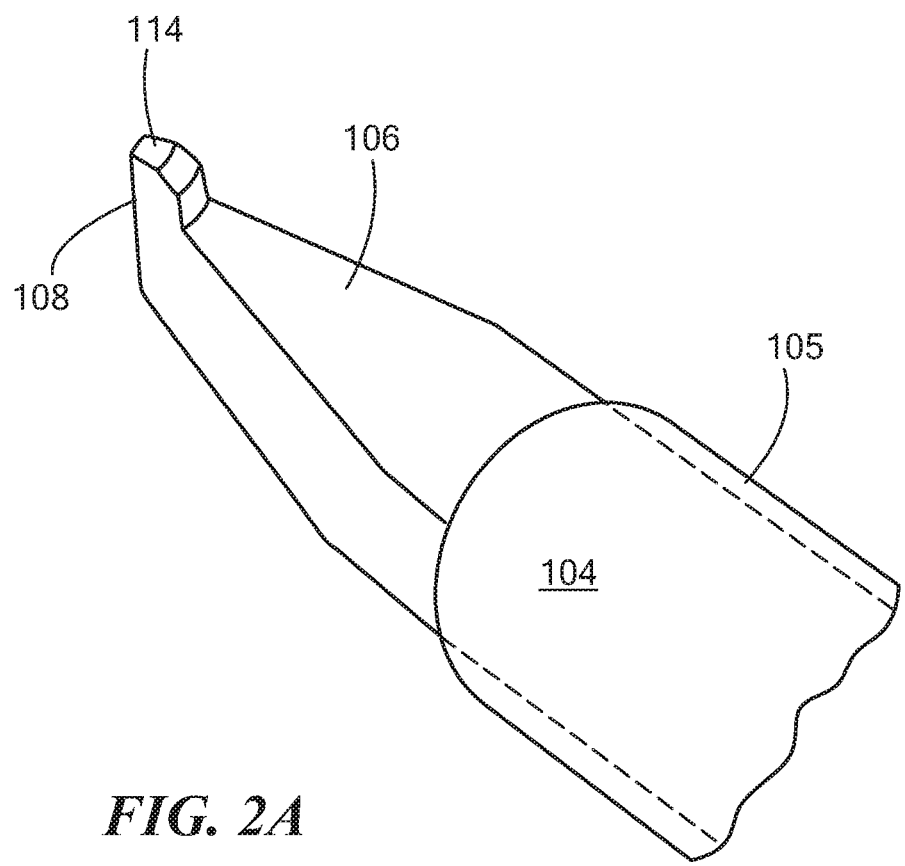
FIG. 2A shows a bottom view of the contact portion and tip of the RF probe of FIG. 1.

Now referring to FIG. 2A, a bottom view of contact portion 106 and tip 108 is provided. As illustrated in FIG. 2A, tip 108 includes a spherical contact surface 114. For example, spherical contact surface 114 can be the portion that contacts and/or probes a surface of a device (e.g., surface 120*a* of device 120 of FIG. 1A).

Spherical contact surface 114 can have a radius that is selected based at least in part on a particular application of the RF probe. The diameter (and radius) of spherical contact surface 114 of tip 108 can be selected based at least in part on a desired pressure factor, a length of a main body (e.g., main body 104 of FIG. 1) and/or a length of contact portion 106. For example, a pressure factor (e.g., vertical pressure, horizontal pressure) applied by tip 108 onto a particular surface can correspond to the length of the main body, the length of contact portion 106 and/or the length of tip 108 itself.

In some embodiments, spherical contact surface 114 may form a complete sphere. In other embodiments, spherical contact surface 114 may have a spherical shape but not form a portion of a sphere (e.g., half a sphere).

In some embodiments, the length of the main body and/or the length of contact portion 106 can be increased to decrease the pressure factor applied by tip 108 onto a particular surface. In other embodiments, the length of the main body and/or the length of contact portion 106 can be decreased to increase the pressure factor applied by tip 108 onto a particular surface. The diameter of spherical contact surface 114 can be sized to increase or decrease the pressure factor applied by tip 108 onto a particular surface. Thus, the diameter of spherical contact surface 114 of tip 108 can be sized based at least in part on the desired pressure factor, length of a main body (e.g., main body 104 of FIG. 1) and/or length of contact portion 106.

Figure 3:
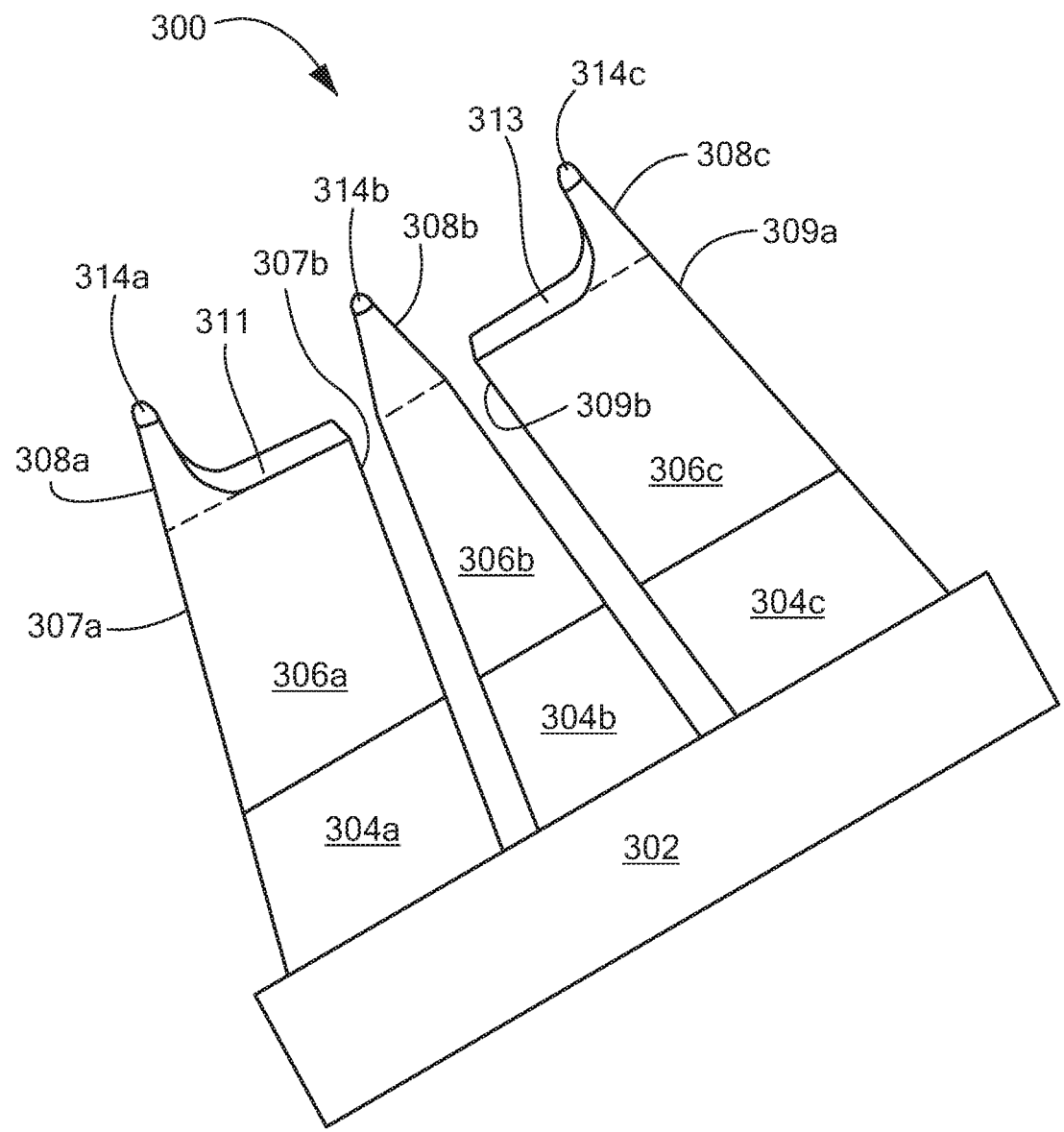
FIG. 3 shows a RF probe having three tips with spherical shapes.

Now referring to FIG. 3, a RF probe 300 is provided having a first tip 308*a*, a second tip 308*b* and a third tip 308*c*. At least a portion of each of first tip 308*a*, second tip 308*b* and third tip 308*c* can be formed having a spherical outer surface. In some embodiments, each of first tip 308*a*, second tip 308*b* and third tip 308*c* can be formed having spherical shapes. As illustrated in FIG. 3, RF probe 300 includes a housing 302 having a first main body 304*a*, a second main body 304*b* and a third main body 304*c*, each extending radially from housing 302.

A first contact portion 306*a* extends radially from first main body 304*a* and first tip 308*a* extends from first contact portion 306*a*. First main body 304*a*, first contact portion 306*a* and first tip 308*a* can be integrally formed. For example, each of first main body 304*a*, first contact portion 306*a* and first tip 308*a* can be formed from the same material. In one embodiment, first main body 304*a*, first contact portion 306*a* and first tip 308*a* can be a single element and refer to three different portions of that single element.

A second contact portion 306*b* extends radially from second main body 304*b* and second tip 308*b* extends from second contact portion 306*b*. Second main body 304*b*, second contact portion 306*b* and second tip 308*b* can be integrally formed. For example, each of second main body 304*b*, second contact portion 306*b* and second tip 308*b* can be formed from the same material. In one embodiment, second main body 304*b*, second contact portion 306*b* and second tip 308*b* can be a single element and refer to three different portions of that single element.

A third contact portion 306*c* extends radially from third main body 304*c* and third tip 308*c* extends from third contact portion 306*c*. Third main body 304*c*, third contact portion 306*c* and third tip 308*c* can be integrally formed. For example, each of third main body 304*c*, third contact portion 306*c* and third tip 308*c* can be formed from the same material. In one embodiment, third main body 304*c*, third contact portion 306*c* and third tip 308*c* can be a single element and refer to three different portions of that single element.

Each of first contact portion 306*a*, second contact portion 306*b* and third contact portion 306*c* can be the same as or substantially similar to contact portion 106 of FIG. 1.

Each of first tip 308*a*, second tip 308*b* and third tip 308*c* can be the same as or substantially similar to tip 108 of FIG. 1. In an embodiment, each of first tip 308*a*, second tip 308*b* and third tip 308*c* can be formed having a spherical contact surfaces 314*a*, 314*b*, 314*c*, respectively, each having a predetermined diameter (and radius). In some embodiments, each of first tip 308*a*, second tip 308*b* and third tip 308*c* can have the same diameter. In other embodiments, first tip 308*a*, second tip 308*b* and third tip 308*c* can have one or more different diameters.

First tip 308*a*, second tip 308*b* and third tip 308*c* can be formed such that they extend from first contact portion 306*a*, second contact portion 306*b* and third contact portion 306*c*, respectively, at the same angle. In other embodiments, first tip 308*a*, second tip 308*b* and third tip 308*c* can be formed such that they extend from first contact portion 306*a*, second contact portion 306*b* and third contact portion 306*c*, respectively, at one or more different angles. For example, in one embodiment, first tip 308*a* and third tip 308*c* can be formed such that they extend from first contact portion 306*a* and third contact portion 306*c*, respectively, at a first angle and second tip 308*b* can be formed such that it extends second contact portion 306*b* at a second, different angle.

In some embodiments, first tip 308*a*, second tip 308*b* and third tip 308*c* can be formed and sized such that they make contact with a surface of a device (e.g., device 120 of FIG. 1A) to be tested at substantially the same time. In other embodiments, first tip 308*a*, second tip 308*b* and third tip 308*c* can be formed and sized such that they make contact with a surface of a device (e.g., device 120 of FIG. 1A) to be tested at one or more different times.

As illustrated in FIG. 3, first tip 308a, second tip 308b and third tip 308c can be formed such that they extend from different portions of edges of first contact portion 306a, second contact portion 306b and third contact portion 306c, respectively. For example, in some embodiments, first tip 308a and third tip 308c can be formed extending from outer edges 307a, 307c of first contact portion 306a and third contact portion 306c, respectively.

First contact portion 306a can include a planar surface 311 and first tip 308a. First tip 308a can be formed such that it is proximate to an outer edge 307a of first contact portion 306a and distal from an inner edge 307b of first contact portion 306a. Inner edge 307b can be the proximate to second contact portion 306b. Thus, first tip 308a can be formed on an opposing edge (outer edge 307a) with respect to inner edge 307b that is proximate to second contact portion 306b. In one embodiment, a distance from first tip 308a and second tip 308b can correspond to a length of planar surface 311 and a distance between first contact portion 306a and second contact portion 306b. The dimensions of planar surface 311 can be selected based in part on a particular application of the RF probe and/or the properties of the device to be tested.

Third contact portion 306c can include a planar surface 313 and third tip 308c. First tip 308 can be formed such that it is proximate to an outer edge 309a of third contact portion 306c and distal from an inner edge 309b of third contact portion 306c. Inner edge 309b can be the proximate to second contact portion 306b. Thus, third tip 308c can be formed on an opposing edge (outer edge 309a) with respect to inner edge 309b that is proximate to second contact portion 306b. In one embodiment, a distance from third tip 308c and second tip 308b can correspond to a length of planar surface 313 and a distance between third contact portion 306c and second contact portion 306b. The dimensions of planar surface 313 can be selected based in part on a particular application of the RF probe and/or the properties of the device to be tested.

Second tip 308b can be formed such that it extends from a middle region of second contact portion 306b. In some embodiments, second tip 308b can be formed such that it covers an entire edge 305 of second contact portion 306b. Thus, in one embodiment, contact portion 306b may not include a planar surface (e.g., planar surfaces 311, 313) in addition to second tip 308b.

First tip 308a, second tip 308b and third tip 308c can be spaced a predetermined distance from each other. The spacing between first tip 308a, second tip 308b and third tip 308c can be selected based in part on a particular application of the RF probe and/or the properties of the device to be tested. In some embodiments, the spacing between each of first tip 308a, second tip 308b and third tip 308c can be the same distance. In other embodiments, the spacing can be different between one or more of first tip 308a, second tip 308b and third tip 308c.

Figure 4:
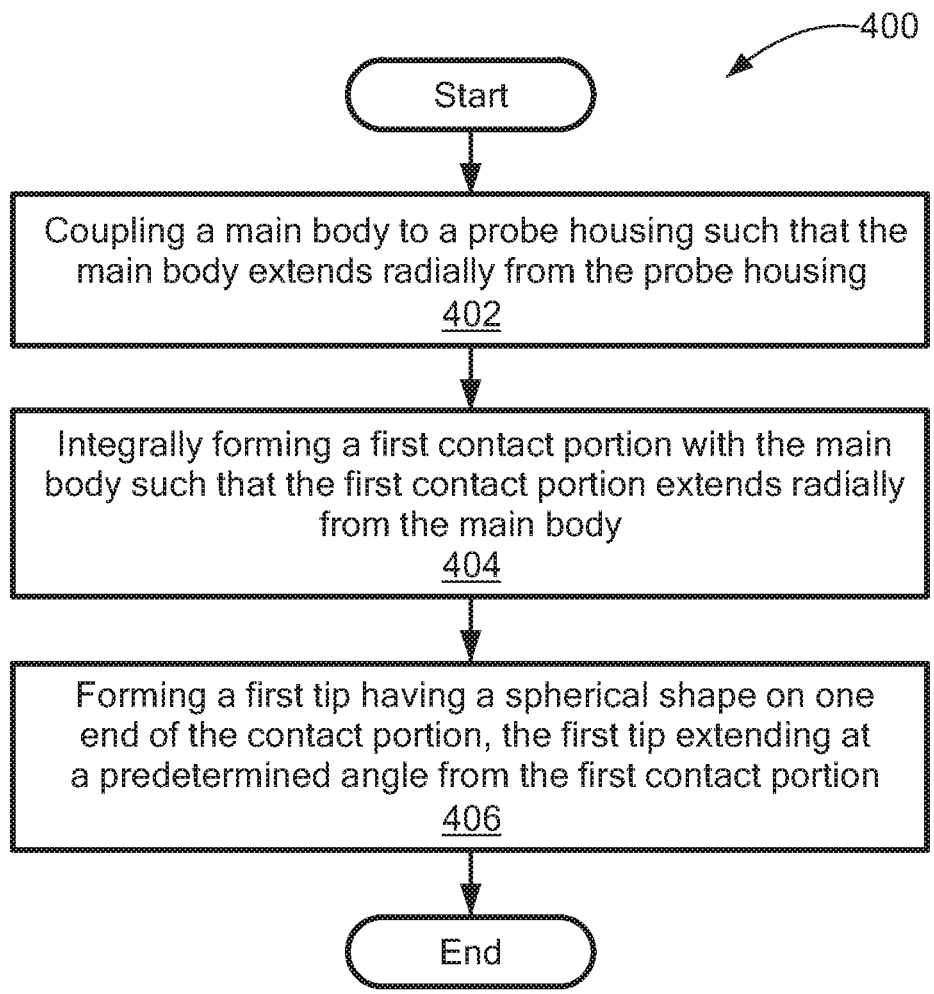
FIG. 4 is a flow diagram of a method for forming an RF probe having a spherical shape.

Now referring to FIG. 4, a method for forming a RF probe begins at block 402 by coupling a main body to a probe housing such that the main body extends radially from the probe housing. The RF probe may include at least one of a microwave probe, high impedance probe, or a probe card. Thus, the probe housing can be formed in a variety of different shapes and geometries to support the particular application of the RF probe. In some embodiments, an insulation layer (e.g., dielectric layer) can be formed over an outer surface of the main body.

The main body can be formed such that it extends radially from a surface of the probe housing. In some embodiments, the main body can be formed such that it extends from a middle portion of the probe housing. A person of ordinary skill in the art will understand how to couple or otherwise connect the main body to the probe housing based at least in part on the particular application of the RF probe.

At block 404, a first contact portion is integrally formed with the main body such that the first contact portion extends radially from the main body. The first contact portion and the main body can be formed from the same material. In some embodiments, the first contact portion and the main body can be different portions of the same element.

The first contact portion can extend at the same angle relative to the probe housing as the main body. The dimensions (e.g., length, width, diameter, etc.) can be selected based at least in part on the RF probe and/or a particular application of the RF probe.

At block 406, a first tip is formed having a spherical shape on one end of the first contact portion. The first contact portion and the first tip can be formed from the same material. In some embodiments, the first contact portion and the first tip can be different portions of the same element.

The first tip can be formed using various machining techniques, such as but not limited to laser cutting (laser trimming), to manipulate and shape an end of the contact portion to have a spherical shape. It should be appreciated however, that first tip can be formed using other machining techniques not described herein. Spherical as used herein may refer to a round shape, globular shape or generally having properties shaped liked a sphere.

The first tip can have a diameter of a predetermined length. The dimensions of the first tip, such as the diameter and radius, can be selected based at least in part on the RF probe and/or a particular application of the RF probe. For example, the tip can be shaped and sized based at least in part on a surface (e.g., surface 120a of device 120) that the RF probe is intended to test and/or probe. Thus, the diameter of the spherical contact surface of the first tip can be selected based on properties of one or more surfaces of the device and/or the type of material of the one or more surfaces of the device.

The RF probe can be formed to apply a desired pressure factor upon a surface of a particular device to be tested. A length of main body, the contact portion and/or the tip can be selected based at least in part on the desired pressure factor. For example, a length of one or more of the main body, the contact portion and/or the tip can be increased to decrease the pressure factor of the RF probe. In other embodiments, a length of one or more of the main body, the contact portion and/or the tip can be decreased to increase the pressure factor of the RF probe.

In some embodiments, a diameter of the tip can be selected based at least in part on the desired pressure factor. For example, the diameter of the tip can be increased to decrease the pressure factor of the RF probe. In other embodiments, the diameter of the tip can be decreased to increase the pressure factor of the RF probe.

The RF probe can be formed having three tips (or probe ends). For example, in some embodiments, a second contact portion and a third contact portion can be integrally formed with the main body such that the second contact portion and the third contact portion extend radially from the main body.

The second and third contact portion can be formed having the same dimensions as the first contact portion. In some embodiments, the first, second and third contact portions and the main body can be formed from the same material.

A second tip and a third tip can be formed on one end of the second and third contact portions, respectively. The second tip and the third tip can be formed having a spherical shape. In an embodiment, the first, second and third tip can be formed having the same dimensions. In one embodiment, the first, second and third tip can be formed extending from the first, second and third contact portions, respectively, at the same angle. In other embodiments, one or more of the first, second and third tip can be formed extending from the first, second and third contact portions, respectively, at one or more different angles.

The second and third tips can be formed using various machining techniques, such as but not limited to laser cutting (laser trimming), to manipulate and shape an end of the second and third contact portions, respectively, to have a spherical shape.

It should be appreciated that the properties and dimensions of each of the main body, the first, second and third contact portions and first, second and third tips can vary based at least in part on a particular application of the RF probe. Those of ordinary skill in the art will understand how to select the particular properties and/or dimensions of each of the main body, the first, second and third contact portions and first, second and third tips for a particular application of the RF probe.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A radio frequency (RF) probe comprising:
   a main body extending from a probe housing, the main body comprising a length corresponding to a pressure factor generated by the RF probe; and
   a contact portion integrally formed with the main body and extending radially from the main body, wherein the contact portion includes a tip having a predetermined diameter corresponding to the length of the main body, and wherein at least a portion of the tip has a spherical outer surface, and the tip extends from the contact portion at a predetermined angle.

2. The RF probe of claim 1, wherein the predetermined angle ranges from about 10 degrees to about 90 degrees.

3. The RF probe of claim 1, wherein the main body, the contact portion and the tip comprise the same material and form a single element.

4. The RF probe of claim 3, wherein the material of the contact portion and the tip includes at least one of beryllium-copper (BeCu), tungsten or nickel.

5. The RF probe of claim 1, further comprising an insulating layer formed over the main body.

6. The RF probe of claim 1, wherein the RF probe includes at least one of a microwave probe, high impedance probe, or a probe card.

7. The RF probe of claim 1, wherein the pressure factor refers to a pressure applied by the RF probe onto a surface of a device being tested by the RF probe.

8. A radio frequency (RF) probe comprising:
   first, second and third main bodies extending from a probe housing, wherein the first main body comprises a length corresponding to a first pressure factor generated by the RF probe, the second main body comprises a length corresponding to a second pressure factor generated by the RF probe, and the third main body comprises a length corresponding to a third pressure factor generated by the RF probe;
   the first, second and third contact portions integrally formed with the first, second and third main bodies, respectively, wherein first, second and third contact portions extending radially from the first, second and third main bodies, respectively; and
   first, second and third tips formed on first, second and third contact portions, respectively, wherein each of the first, second and third tip has a predetermined diameter corresponding to the length of the first, second and third main body respectively, wherein at least a portion of each of the first, second and third tip has a spherical outer surface, and wherein the first, second and third tips extend from the first, second and third contact portions, respectively, at a predetermined angle.

9. The RF probe of claim 8, further comprising a first planar surface formed on an edge of the first contact portion and adjacent to the first tip and a second planar surface formed on an edge of the third contact portion and adjacent to the third tip.

10. The RF probe of claim 8, the first, second and third tips are spaced a predetermined distance from each other.

11. The RF probe of claim 8, wherein the first, second and third main body, the first, second and third contact portions and the first, second and third tips comprise the same material and form a single element.

12. A method for forming a radio frequency (RF) probe, the method comprising:
   coupling a first main body to a probe housing such that the first main body extends radially from the probe housing, wherein a length of the first main body corresponds to a first pressure factor generated by the RF probe;
   integrally forming the first contact portion with the first main body such that the first contact portion extends radially from the first main body; and
   forming a first tip on one end of the first contact portion, wherein first tip has a predetermined diameter corresponding to the length of the first main body, wherein at least a portion of the first tip has a spherical outer surface, and wherein the first tip extends at a at a predetermined angle from the first contact portion.

13. The method of claim 12, further comprising:
   coupling a second main body and a third main body to the probe housing such that the second main body and the third main body extend radially from the probe housing, wherein the second main body corresponds to a second pressure factor generated by the RF probe and the third main body corresponds to a third pressure factor generated by the RF probe;
   integrally forming the second contact portion and the third contact portion with the second and third main bodies such that the second contact portion and the third contact portion extend radially from the second and third main bodies, respectively;
   forming a second tip on one end of the second contact portion, wherein the second tip has a predetermined diameter corresponding to the length of the second main body, wherein at least a portion of the second tip has a spherical outer surface, and wherein the second tip extends at the predetermined angle from the second contact portion; and forming a third tip on one end of the third contact portion, wherein the third tip has a predetermined diameter corresponding to the length of the third main body, wherein at least a portion of the third tip has a spherical outer surface, and wherein the third tip extends at the predetermined angle from the third contact portion.

14. The RF probe of claim 12, wherein the pressure factor refers to a pressure applied by the RF probe onto a surface of a device being tested by the RF probe.

* * * * *